(12) United States Patent
Wang et al.

(10) Patent No.: US 9,837,311 B2
(45) Date of Patent: Dec. 5, 2017

(54) CONDUCTIVE PLUG STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Liang Wang, Shanghai (CN); Xiaotian Ma, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/277,853

(22) Filed: Sep. 27, 2016

(65) Prior Publication Data

US 2017/0092537 A1 Mar. 30, 2017

(30) Foreign Application Priority Data

Sep. 30, 2015 (CN) .......................... 2015 1 0640892

(51) Int. Cl.
*H01L 21/76* (2006.01)
*H01L 23/52* (2006.01)
(Continued)

(52) U.S. Cl.
CPC .... *H01L 21/76879* (2013.01); *H01L 21/2885* (2013.01); *H01L 21/76829* (2013.01);
(Continued)

(58) Field of Classification Search
CPC ..... H01L 23/52; H01L 23/522; H01L 23/528; H01L 23/5226; H01L 23/53;
(Continued)

(56) References Cited

U.S. PATENT DOCUMENTS 8,394,718 B1 3/2013 Gambino
2004/0253813 A1 12/2004 Son
(Continued)

FOREIGN PATENT DOCUMENTS

JP 2012164711 8/2012

*Primary Examiner* — Monica D Harrison
(74) *Attorney, Agent, or Firm* — Anova Law Group, PLLC (57) ABSTRACT

The present disclosure provides conductive plug structures and fabrication methods thereof. An exemplary fabrication process of the conductive plug structure includes providing a substrate; forming a mask layer having an opening on a surface of the substrate; etching the substrate to form a contact hole using the mask layer as an etching mask; etching the mask layer to increase a feature size of the opening; forming an insulation layer on an inner surface of the opening, an inner surface of the enlarged opening and a surface of the mask layer to have more edge corners, a thickness of the insulation layer being greater than a thickness of the remaining mask layer; forming a conductive layer filling the contact hole on the insulation layer; and planarizing the conductive layer and the insulation layer until a surface of the mask layer is exposed.

20 Claims, 5 Drawing Sheets (51) Int. Cl.
*H01L 21/768* (2006.01)
*H01L 23/522* (2006.01)
*H01L 23/528* (2006.01)
*H01L 23/532* (2006.01)
*H01L 21/288* (2006.01)

(52) U.S. Cl.
CPC .. *H01L 21/76843* (2013.01); *H01L 21/76883* (2013.01); *H01L 21/76898* (2013.01); *H01L 23/528* (2013.01); *H01L 23/5226* (2013.01); *H01L 23/5329* (2013.01); *H01L 23/53209* (2013.01)

(58) Field of Classification Search
CPC . H01L 23/532; H01L 23/532; H01L 23/5329; H01L 23/53209; H01L 21/76; H01L 21/768; H01L 21/7682; H01L 21/7684; H01L 21/7687; H01L 21/7688; H01L 21/76879; H01L 21/76829; H01L 21/76843; H01L 21/76883
USPC .......................................................... 257/751
See application file for complete search history.

(56) References Cited

U.S. PATENT DOCUMENTS

2006/0216921 A1     9/2006  Kato
2013/0270713 A1*  10/2013  Liao .................. H01L 21/76898
                                                                257/774

\* cited by examiner

CONDUCTIVE PLUG STRUCTURE AND FABRICATION METHOD THEREOF

CROSS-REFERENCES TO RELATED APPLICATIONS

This application claims the priority of Chinese patent application No. 201510640892.6, filed on Sep. 30, 2015, the entirety of which is incorporated herein by reference.

FIELD OF THE INVENTION

The present invention generally relates to the field of semiconductor manufacturing and, more particularly, relates to conductive plug structures and fabrication processes thereof.

BACKGROUND

With the continuous development of semiconductor technology, the critical dimension of semiconductor devices has become smaller and smaller, increasing the number of the semiconductor devices in a two-dimensional interconnect structure has become more and more difficult. Thus, three-dimensional packaging methods have been used to increase the integration level of semiconductor devices.

The three-dimensional packaging methods include the die stacking method and the package stacking method based on metal wire bonding, and the three-dimensional stacking method based on through silicon via (TSV) technique. The three-dimensional stacking method utilizing the TSV technique may have certain advantages, such as high integration level and significantly reduced interconnect length, etc. Thus, it is able to effectively solve the signal delay issue of the semiconductor devices in the two-dimensional system. Further, using the TSV technique may be able to integrate the modules with different functions, such as radio frequency module, memory module, logic module and the micro-electro-mechanical system, etc., to achieve the packaging process. Thus, the three-dimensional stacking method utilizing the TSV technique has become more and more important in the semiconductor packaging technology.

The fabrication process of a conductive plug structure based on the TSV technique includes providing a substrate; etching the substrate to form a contact hole in the substrate; forming an insulation layer on the inner side surfaces of the contact hole and the substrate; forming a conductive layer on the insulation layer and to fill the contact hole by a physical vapor deposition process or an electroplating process; and removing the conductive layer on the surface of the substrate by a chemical mechanical polishing process. The insulation layer is used to electrically insulate the subsequently formed conductive layer.

However, the performance of the conductive plug structure formed by such existing fabrication methods may not be as desired. The disclosed device structures and methods are directed to solve one or more problems set forth above and other problems in the art.

BRIEF SUMMARY OF THE DISCLOSURE

One aspect of the present disclosure includes a fabrication method of a conductive plug structure. An exemplary fabrication method of the conductive plug structure includes providing a substrate; forming a mask layer having an opening on a surface of the substrate; etching the substrate to form a contact hole using the mask layer as an etching mask; etching the mask layer to enlarge a feature size of the opening; forming an insulation layer on an inner surface of the opening, an inner surface of the enlarged opening and a surface of the mask layer, a thickness of the insulation layer being greater than a thickness of the remaining mask layer, and the insulation layer having a plurality of edge corners; forming a conductive layer filling the contact hole on the insulation layer; and planarizing the conductive layer and the insulation layer until a surface of the mask layer is exposed.

Another aspect of the present disclosure includes a method for forming a conductive plug structure. The method includes providing a substrate; forming a mask layer having an opening on a surface of the substrate; etching the substrate to form a contact hole using the mask layer as an etching mask; etching the mask layer to increase a feature size of the opening; forming an insulation layer on an inner surface of the opening, an inner surface of the enlarged opening and a surface of the mask layer to have more edge corners, a thickness of the insulation layer being greater than a thickness of the remaining mask layer; forming a barrier layer on the insulation layer; forming a conductive layer filling the contact hole on the barrier layer; and planarizing the conductive layer, the barrier layer and the insulation layer until a surface of the mask layer is exposed.

Another aspect of the present disclosure includes a conductive plug structure. The conductive plug structure includes a substrate; a conductive layer penetrating into the substrate; and an insulation layer formed between the substrate and the conductive layer. The conductive layer is formed by forming a mask layer having an opening on a surface of the substrate; etching the substrate to form a contact hole using the mask layer as an etching mask; etching the mask layer to enlarge a feature size of the opening; forming an insulation layer on an inner surface of the opening, an inner surface of the enlarged opening and a surface of the mask layer, a thickness of the insulation layer being greater than a thickness of the remaining mask layer, and insulation layer having a plurality of edge corners; forming a conductive layer filling the contact hole on the insulation layer; and planarizing the conductive layer and the insulation layer until a surface of the mask layer is exposed.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
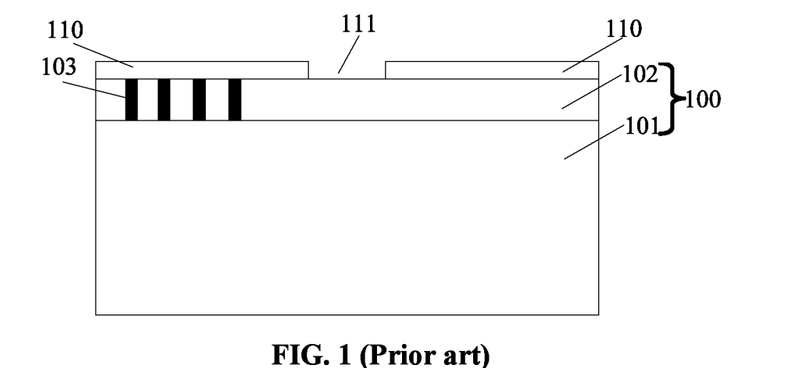
FIGS. 1-4 illustrate structures corresponding certain stages of an existing fabrication process of a conductive plug structure.

FIGS. 1-4 illustrate structures corresponding to certain stages of an existing fabrication method of a conductive plug structure. As shown in FIG. 1, the method includes providing a substrate 100; and forming a mask layer 110 having an opening 111 on the surface of the substrate 100.

The substrate 100 includes a semiconductor substrate 101 and an interlayer dielectric layer 102 formed on the surface of the semiconductor substrate 101. Further, transistors 103 may be formed in the interlayer dielectric layer 102.

Figure 2:
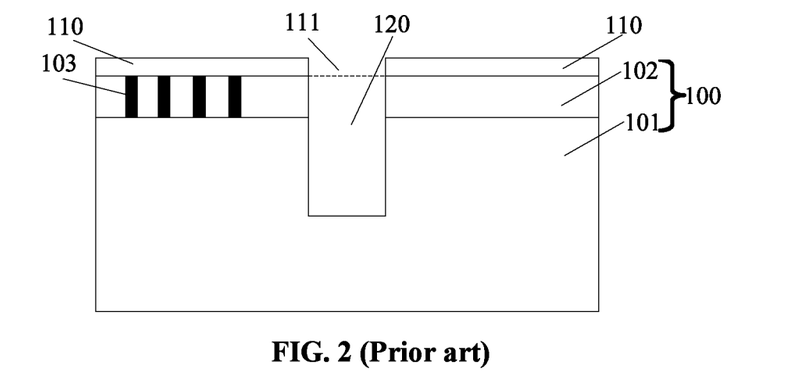

Further, as shown in FIG. 2, the method includes etching the substrate 100 using the mask layer 110 as an etching mask to form the contact hole 120 in the substrate 100. The dashed line refers to the boundary between the opening 111 and the contact hole 120.

Figure 3:
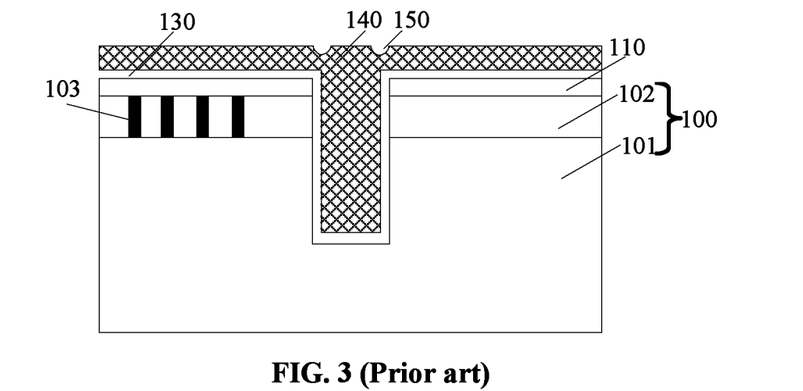

Further, as shown in FIG. 3, after forming the contact hole 120, an insulation layer 130 is formed on the inner surface of the contact hole 120 and the surface of the mask layer 110; and a conductive layer 140 is formed on the surface of the insulation layer 130. The conductive layer 140 fills the contact hole 120.

The conductive layer 140 is made of Cu; and is formed by an electroplating process. The electroplating solution may include copper sulfate, sulfuric acid and inhibitor, etc.

Figure 4:
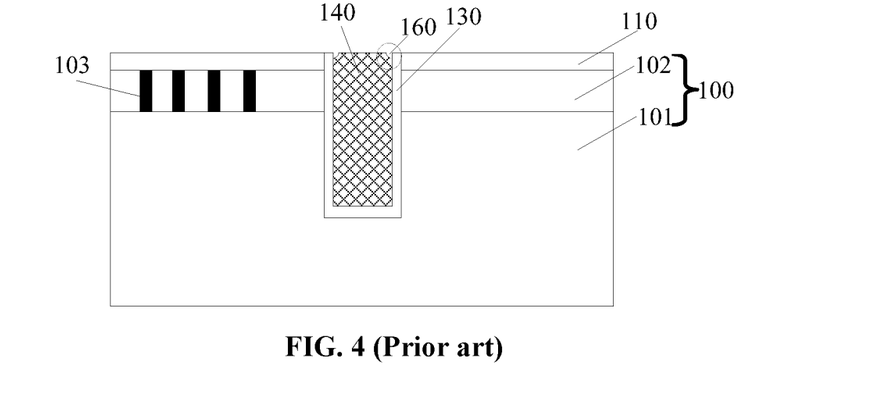

Further, as shown in FIG. 4, after forming the conductive layer 140, a planarization process may be performed until the surface of the mask layer 110 is exposed. Thus, the conductive plug structure is formed.

When using this method, at the beginning of the fabrication process, in order to prevent the top of the contact hole 120 from being closed too early, and forming voids, it needs to add the inhibitor in the electroplating solution. The inhibitor is often a high-molecular weight compound; and has a relatively strong absorbing ability at the high current region (the sharp edge corner regions of the contact hole 120). Thus, the inhibitor prevents the diffusion of Cu ions on the surface Cu. Accordingly, the growth of Cu at the sharp edge corner regions of the contact hole 120 is prevented. The growth includes the lateral growth and the vertical growth. The inhibitor prevents the growth from both directions. Thus, pit defects 150 are formed in the conductive layer 140 at the sharp edge corner regions of the contact hole 120 (As shown in FIG. 3).

Further, during the planarization process, the surfaces of the pit defects 150 and the surface of the conducive layer 140 may be polished simultaneously. When the surface of the mask layer 110 is exposed, the peripheral surface of the remaining conductive layer 140 is lower the central surface of the remaining conductive layer 140. Thus, the pit 160 (as shown in FIG. 4) is formed in the peripheral region of the remaining conductive layer 140. A metal layer is subsequently formed on the surface of the remaining conductive layer 140. On one hand, the contact between the metal layer and the remaining conductive layer 140 may not be as desired. Thus, the conductivity of the conductive plug structure may be reduced. On the other hand, the atoms in the remaining conductive layer 140 may easily diffuse, and the remaining conductive layer 140 may have electron-migration and stress-migration. Thus, the reliability of the conductive plug structure may be reduced.

Figure 13:
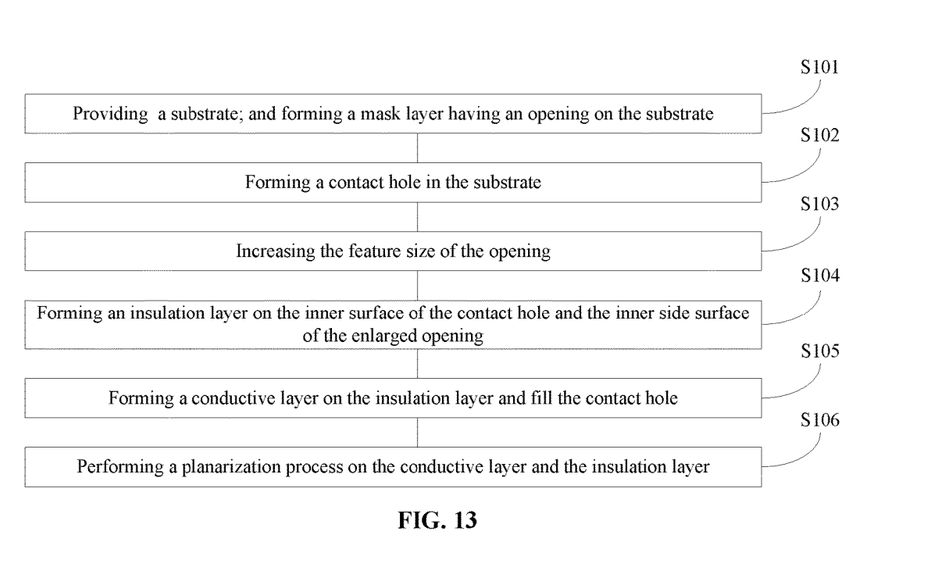
FIG. 13 illustrates an exemplary fabrication process of a conductive plug structure consistent with the disclosed embodiments.

The present disclosure provides an improved fabrication method of a conductive plug structure. FIG. 13 illustrates an exemplary fabrication process of a conductive plug structure consistent with the disclosed embodiments. FIGS. 5-10 illustrate structures corresponding to certain stages of the exemplary fabrication process.

Figure 5:
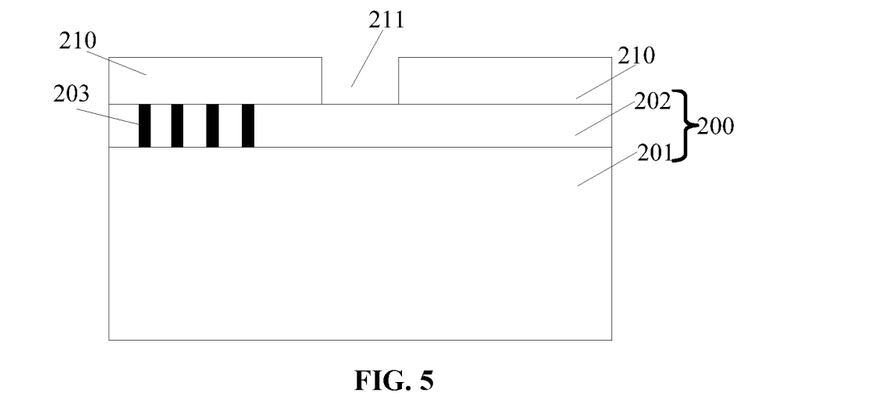
FIGS. 5-10 illustrate structures corresponding to certain stages of an exemplary fabrication process of a conductive plug structure consistent with the disclosed embodiments.

As shown in FIG. 13, at the beginning of the fabrication process, a substrate is provided; and a mask layer is formed on the substrate (S101). FIG. 5 illustrates a corresponding structure.

As shown in FIG. 5, a substrate 200 is provided; and a mask layer 210 is formed on a surface of the substrate 200. Further, an opening 211 may be formed in the mask layer 210.

The substrate 200 may include a semiconductor substrate 201 and an interlayer dielectric layer 202 formed on the surface of the semiconductor substrate 201. The semiconductor substrate 201 may be made of any appropriate material, such as single crystal silicon, polycrystalline silicon, or amorphous silicon, etc. The semiconductor substrate 201 may also be made of other semiconductor material, such as germanium, silicon germanium, or gallium arsenide, etc. In one embodiment, the substrate 200 is made silicon.

A plurality of transistors 203 may be formed in the interlayer dielectric layer 202. The transistors 203 may be electrically connected with other devices subsequently formed on the surface of the interlayer dielectric layer 202 through the subsequently formed conductive plugs. In one embodiment, the interlayer dielectric layer 202 is made of silicon oxide, or silicon oxynitride, etc.

The mask layer 210 may be made of any appropriate material, such as silicon oxide, or silicon oxynitride, etc. The mask layer 210 may also be used as a stop layer for a subsequent planarization process. The mask layer 210 may be a hard mask layer, during the subsequent etching process for forming a contact hole, the lateral etching may be reduced.

Further, because the mask layer 210 may be subsequently etched, the thickness of the mask layer 210 may be reduced during the etching process. Thus, the thickness of the mask layer 210 may be pre-determined with an appropriate value. In one embodiment, the thickness of the mask layer 210 may be in a range of approximately 4000 Å-6000 Å.

Figure 6:
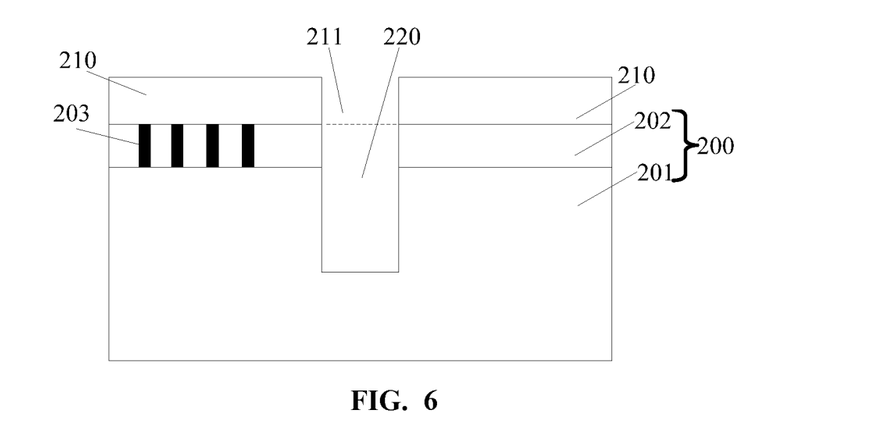

Returning to FIG. 13, after forming the mask layer 210, a contact hole may be formed (S102). FIG. 6 illustrates a corresponding structure.

As shown in FIG. 6, a contact hole 220 is formed in the substrate 200. The contact hole 220 may be formed by etching the substrate 200 using the mask layer 210 as an etching mask. The dashed line refers to the boundary between the contact hole 220 and the opening 211.

Various processes may be used to form the contact hole 220, such as a dry etching process, or a wet etching process, etc. In one embodiment, a deep reactive ion etching (DRIE) process may be used to etch the substrate 200 to form the contact hole 220. The DRIE process may be a Bosch DRIE process or a Cryogenic DRIE process.

In one embodiment, a Bosch DRIE process is used to etch the substrate 200 to form the contact hole 220. Specifically, the mask layer 210 may be used as the etching mask; and etching gases and protective gases may be alternatively introduced to alternatively etch the semiconductor substrate 201 and protect the formed side surfaces until the contact hole 220 with a pre-determined size and geometry is formed.

In one embodiment, the bottom of the contact hole 220 may be inside the semiconductor substrate 201. In certain other embodiments, the bottom of the contact hole 220 may level with the bottom surface of the interlayer dielectric layer 202. That is, the contact hole 220 may be through the interlayer dielectric layer 202.

Figure 7:
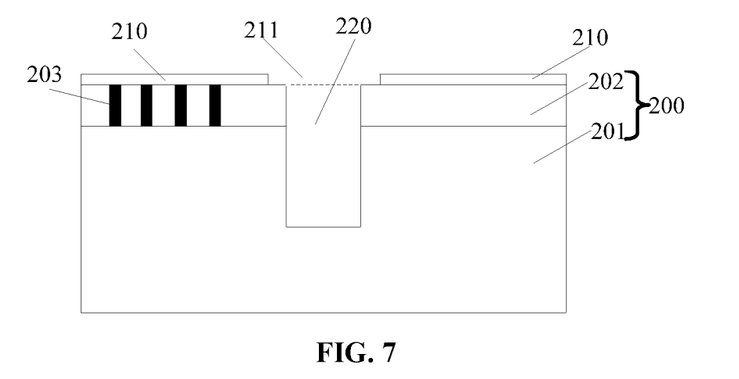

Returning to FIG. 13, after forming the contact hole 20, the feature size of the opening 211 may be increased (S103). FIG. 7 illustrates a corresponding structure.

As shown in FIG. 7, the feature size of the opening 211 is creased; and the portion of the surface of the substrate 200 around the contact hole 220 may be exposed. That is, the size of the opening 211 may be enlarged, and the portion of the surface of the interlayer dielectric layer 202 around the contact hole 220 may be exposed. As used herein, the feature size of the opening 211 may refer to as the feature size of the opening 211 parallel to the surface of the substrate 200.

The feature size of the opening 211 may be increased by etching the mask layer 210. The mask layer 210 may be etched by any appropriate process, such as a dry etching process, or a wet etching process, etc. In one embodiment, a wet etching process is used to etch the mask layer 210 to increase the feature size of the opening 211.

The wet etching process may isotropically etch the mask layer 210. During the process for etching the mask layer 210, when the feature size of the opening 211 is being increased, the thickness of the mask layer 210 may also be reduced. After the etching process, the thickness of remaining mask layer 210, i.e., the left mask layer 210 after the etching process, may be in a range of approximately 800 Å-1200 Å.

The etching solution of the wet etching process may include any appropriate chemicals. In one embodiment, the etching solution of the wet etching process is phosphoric acid solution.

The concentration of phosphoric acid may be an appropriate value. If the concentration of phosphoric acid is significantly high, the etching rate of the mask layer 210 may be significantly high, it may be unable to control the thickness of the remaining mask layer 210 and the feature size of opening 211; and the thickness of the remaining mask layer 210 and the feature size of the opening 211 after the etching process may have a significant fluctuation. If the concentration of phosphoric acid is substantially low, the etching rate of the mask layer 210 may be substantially low; and the process efficiency may be reduced. Thus, in one embodiment, the mass percentage of phosphoric acid may be in a range of approximately 80%-90%. Specifically, the mass percentage of phosphoric acid may be approximately 85%.

The temperature of the etching process may be any appropriate value. If the temperature is significantly high, the etching rate of the mask layer 210 may be significantly high, it may be unable to control the thickness of the remaining mask layer 210 and the feature size of the mask layer 210; and the thickness of the remaining mask layer 210 and the feature size of the opening 211 after the etching process may have a significant fluctuation. If the temperature is substantially low, the etching rate of the mask layer 210 may be substantially low; and the process efficiency may be reduced. Thus, in one embodiment, the temperature of the etching process may be in a range of approximately 120° C.-180° C. Specially, the temperature of the etching process may be approximately 160° C.

In certain other embodiments, a dry etching process may be used to etch the mask layer 210. A patterned photoresist layer may be formed on the mask layer 210. The patterned photoresist layer may define the position of the opening 211 after the etching process. Then, the patterned photoresist layer may be used as an etching mask to etch the mask layer 201 to increase the feature size of the opening 211.

The increased feature size of the opening 211 may have a pre-determined value. If the increased feature size of the opening 211 is significantly large, the stop-layer function of the mask layer 210 during the subsequent planarization process of a conductive layer and an insulation layer may be reduced. If the increased feature size of the opening 211 is substantially small, during the subsequent process for forming a conductive layer, the positions of the pit defects formed in the conductive layer may have a relatively short distance with the contact hole 220. During the subsequent planarization process of the conductive layer and the insulation layer, the pit formed by following the etching of the pit defects may also have a relatively short distance with the contact hole 220. Thus, during the subsequent planarization process to expose the surface of the mask layer 210, the pit may not be entirely removed. Thus, in one embodiment, after the etching process, the ratio between the feature size of the opening 211 and the feature size of contact hole 220 may be in a range of approximately 1.02-1.1.

Figure 8:
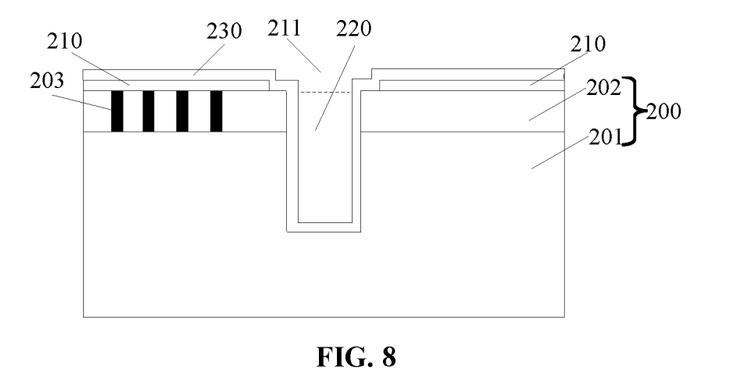

Returning to FIG. 13, after increasing the feature size of the opening 211, an insulation layer may be formed (S104). FIG. 8 illustrates a corresponding structure.

As shown in FIG. 8, an insulation layer 230 is formed on the inner surface of the contact hole 220, the surface of the remaining mask layer 210 and the inner surface of the opening 211. The thickness of the insulation layer 230 may be equal to or greater than the thickness of the remaining mask layer 210.

In one embodiment, the thickness of the insulation layer 230 is equal to the thickness of the remaining mask layer 210. During the practical process, it may be difficult to control the thickness of the insulation to be equal to the thickness of the remaining mask layer 210. Thus, in certain other embodiments, the thickness of the insulation layer 230 is greater than the thickness of the remaining mask layer 210. Thus, the fabrication process of the insulation layer 230 may be simplified.

The insulation layer 230 may be used to electrically insulate the subsequently formed conductive layer and the substrate 200. Further, the insulation layer 230 may cover the surface of the remaining mask layer 210 and the inner surface of the contact hole 220 and the inner surface of the opening 211. Such a geometry may cause the portion of the insulation layer 230 on the surface of the remaining mask layer 210 to be higher than the portion of the insulation layer 230 covering the exposed portion of the surface of the interlayer dielectric layer 202 around the contact hole 220.

The insulation layer 230 may be made of any appropriate material. In one embodiment, the insulation layer 230 is made of silicon oxide.

Various processes may be used to form the insulation layer 230, such as an atmospheric pressure chemical vapor deposition (APCVD) process, a plasma enhanced chemical vapor deposition (PECVD) process, a low pressure chemical vapor deposition (LPCVD) process, or an atomic layer deposition (ALD) process, etc. In one embodiment, the insulation layer 230 is formed by an ALD process.

Because the portion of the insulation layer 230 on the surface of the remaining mask layer 210 may be higher than the portion of the insulation layer 230 covering the exposed portion of the surface of the interlayer dielectric layer 202 around the contact hole 220, the number of the edge corners in the insulation layer 230 may be increased. That is, the insulation layer 230 may not only have edge corners over the contact hole 220, but also form edge corners between the portion of the insulation layer 230 on the surface of the remaining mask layer 210 and the portion of the insulation layer 230 covering the exposed portion of the surface of the interlayer dielectric layer 202 around the contact hole 220.

In one embodiment, the thickness of the insulation layer 230 is equal to or greater than the thickness of the remaining mask layer 210. Specifically, the thickness of the insulation layer 230 may be in a range of approximately 2000 Å-5000 Å.

Figure 9:
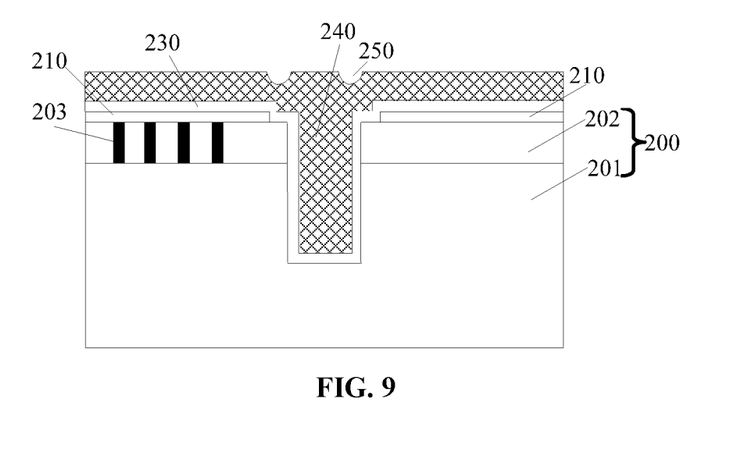

Returning to FIG. 13, after forming the insulation layer 230, a conductive layer may be formed (S105). FIG. 9 illustrates a corresponding semiconductor structure.

As shown in FIG. 9, a conductive layer 240 is formed on the surface of the insulation layer 230. The conductive layer 240 may also fill the contact hole 220. The conductive layer 240 may be made of any appropriate material, such as Ta, TaN, or Cu, etc. In one embodiment, the conductive layer 240 is made of Cu.

Various processes may be used to form the conductive layer 240, such as a PVD process, or an electroplating process, etc. In one embodiment, the conductive layer 240 is formed by an electroplating process.

Specifically, a Cu seed layer (not shown) may be formed on the surface of the insulation layer 230. Then, the substrate 200 may be transferred to an electroplating reaction bath. The electroplating bath may have an electroplating solution, a metal Cu anode, and a negative electrode of a power source. The electroplating solution may include $CuSO_4$, $H_2SO_4$ and water, etc. The electroplating solution may also include catalyst, inhibitor, and adjusting regents, etc. The inhibitor may be one and or more of polyethylene glycol, and polyoxypropylene glycol, etc.

In one embodiment, a specific electroplating process may include connecting the Cu seed layer with the negative electrode of the power source; and connecting the metal Cu anode with the positive electrode of the power source. The Cu atoms on the metal Cu anode may have an oxidation reaction; and Cu ions may be formed. The Cu ions near the surface of the Cu seed layer may have a reduction reaction to form Cu atoms on the surface of the Cu seed layer. Thus, the conductive layer 240 may be formed.

At the initial stage of the formation of the conductive layer 240, to prevent the top of the contact hole 220 from being closed too early and form voids in the conductive layer 240 in the contact hole 220, it may need to add the inhibitor in the electroplating solution. The inhibitor may be a high-molecular compound; and may have a relatively strong absorption ability in the high-current regions. Because the edge corners of the insulation layer 230 may be the high-current regions, the inhibitor may be absorbed on the edge corners of the insulation layer 240; and prohibit the growth of the conductive layer 240 at the edge corners. At the edge corners of the insulation layer 240, the inhibitor may prevent the growth of the conductive layer from both the lateral direction and the vertical direction. Thus, the pit defects 250 may be formed in the conductive layer 240.

Although the pit defects 250 may be formed in the conducive layer 240, the pit defects 250 may have following characteristics. First, the lateral distance between the bottoms of the pit defects 250 and the contact hole 220 may be relatively far. Because the edge corners of the insulation layer 230 may not only locate above the side surface of the contact hole 220, they may also be formed between the portions of the insulation layer 230 on the surface of the remaining mask layer 210 and the exposed surface of the substrate 200 (or the interlayer dielectric layer 210).

Thus, during the initial stage for forming the conductive layer 240, the inhibitor in the electroplating solution may be distributed on a plurality of edge corners. The number of the edge corners is greater than the number of edge corners of an insulation layer formed without increasing the feature size of the opening in the mask layer. Such a distribution of the inhibitor may avoid an excessively distribution of the inhibitor on the edge corners above the top of the side surface of the contact hole 220. Thus, the inhibiting effect on the vertical growth of the conductive layer 240 above the side surface of the contact hole 220 may be reduced. Accordingly, the positions of the pit defects 250 formed in the conductive layer 240 may be pushed toward the side surface of the opening 211. During the subsequent planarization process, the pit defects 250 may be entirely removed; and the quality of the contact between the subsequently formed metal layer the conducive layer 240 may be improved. Accordingly, the quality of the conductive plug structure may be improved.

Figure 10:
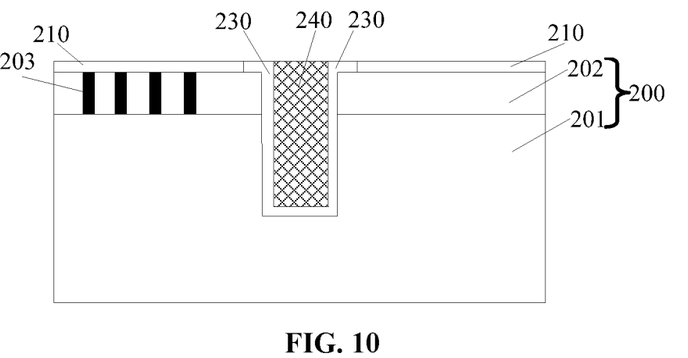

Returning to FIG. 13, after forming the conductive layer 240, a planarization process may be performed (S106). FIG. 10 illustrates a corresponding structure.

As shown in FIG. 10, a planarization process is performed onto the conductive layer 240 and the insulation layer 230 until the surface of the mask layer 210 is exposed. After the planarization process, a conductive plug structure (not labeled) may be formed.

The planarization process may be any appropriate process, such as a chemical mechanical polishing process, or a physical mechanical polishing process. In one embodiment, the planarization process is a chemical mechanical polishing process. During the planarization process of the conductive layer 240 and the insulation layer 230, the mask layer 210 is used as a stop layer.

Because the lateral distance between the bottoms of the pit defects 250 and the contact hole 220 may be relatively large. Further, the thickness of the insulation layer 230 may be greater than the thickness of the remaining mask layer 210. Although the surfaces of the pit defects 250 may also be recessed, or lowered, during the planarization process, when the planarization process is performed until the surface of the remaining mask layer 210 is exposed, the recessed pit defects 250 may be entirely removed. Thus, it may avoid forming a pit between the conductive layer 240 and the insulation layer 230.

When a metal layer is subsequently formed on the conductive layer 240, the unacceptable contact between the conductive layer 240 and the metal layer may be avoided; and the conductivity of the conductive plug structure may be improved. Further, the diffusion of the atoms in the conductive layer 240 may be prevented. Thus, the electro-migration and stress-migration may be avoided. Accordingly, the reliability of the conductive plug structure may be improved; and the performance of the conductive plug structure may be enhanced.

Thus, a conductive plug structure may be formed be the disclosed methods and processes. FIG. 10 illustrates a corresponding structure. As shown in FIG. 10, the conductive plug structure may include a substrate 200; and a conductive layer 240 penetrating through the substrate 200. The conductive plug structure may also include an insulation layer 330 formed between the conductive layer 240 and the substrate 200. The detailed structures and intermediate structures are described above with respect to the fabrication processes.

Figure 11:
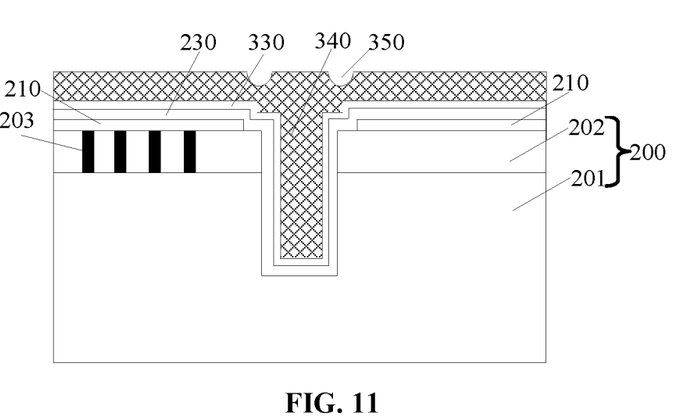
FIGS. 11-12 illustrate structures corresponding to certain stages of another exemplary fabrication process of a conductive plug structure consistent with the disclosed embodiments.
Figure 12:
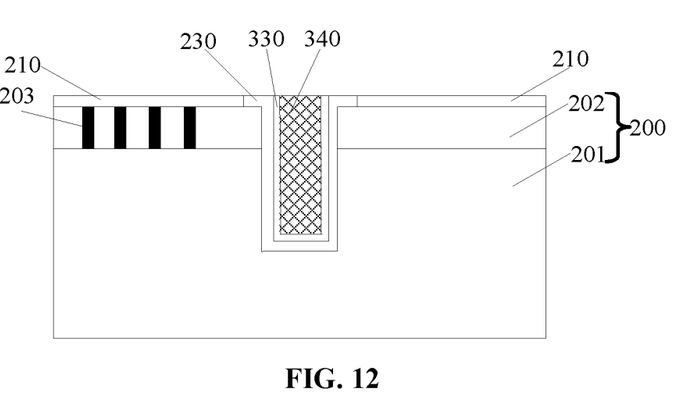

In certain other embodiments, a barrier layer may be formed between the insulation layer and the conductive layer. FIGS. 11-12 illustrate structures corresponding to certain structures of an exemplary fabrication of a conductive plug structure having the barrier layer. The fabrication process will be described based on the structure illustrated in FIG. 8.

As shown in FIG. 11, after forming the insulation layer 230, a barrier layer 330 may be formed on the insulation layer 230. Then, a conductive layer 340 may be formed on the surface of the barrier layer 330. The conductive layer 340 may fill the contact hole 220 (referring to FIG. 8).

The barrier layer 330 may be used to prevent the diffusion of the metal atoms in the conductive layer 340. The barrier layer 330 may be made of any appropriate material, such as TiN, or TaN, etc.

The thickness of the barrier layer 330 may be any appropriate value. If the thickness of the barrier layer 330 is significantly large, the space for filling the conductive layer 340 may be substantially small; and the filling of the conductive layer 340 may be affected. If the thickness of the barrier layer is substantially small, the ability to prevent the diffusion of the metal atoms in the conductive layer 340 may be reduced. Thus, in one embodiment, the thickness of the barrier layer 330 may be in a range of approximately 800 Å-1500 Å.

Various processes may be used to form the barrier layer 330, such as a PVD process, or an ALD process, etc. In one embodiment, the barrier layer 330 is formed by a PVD process.

The conductive layer 340 may be made of any appropriate material, such as Ta, TaN, or Cu, etc. In one embodiment, the conductive layer 340 is made of Cu.

Various processes may be used to form the conductive layer 340, such as a PVD process, or an electroplating process, etc. In one embodiment, the conductive layer 340 is formed by an electroplating process.

Specifically, a Cu seed layer (not shown) may be formed on the surface of the barrier layer 330. Then, the substrate 200 may be transferred to an electroplating reaction bath. The electroplating bath may have an electroplating solution, a metal Cu anode, and a cathode of a power source. The electroplating solution may include $CuSO_4$, $H_2SO_4$ and water, etc. The electroplating solution may also include catalyst, inhibitor, adjusting regents, etc. The inhibitor may be one and or more of polyethylene glycol, and polyoxypropylene glycol, etc.

In one embodiment, a specific electroplating process may include connecting the Cu seed layer with the negative electrode of the power source; and connecting the metal Cu anode with the positive electrode of the power source. The Cu atoms on the metal Cu anode may have an oxidation reaction; and Cu ions may be formed. The Cu ions near the surface of the Cu seed layer may have a reduction reaction to form Cu atoms on the surface of the Cu seed layer. Thus, the conductive layer 340 may be formed.

At the initial stage of the formation of the conductive layer 340, to prevent the top of the contact hole 220 from being closed too early and form voids in the conductive layer 340 in the contact hole 220, it may need to add the inhibitor in the electroplating solution. The inhibitor may be a high-molecular compound; and may have a relatively strong absorption ability in the high-current region. Because the edge corners of the barrier layer 330 (or the insulation layer 230) may be the high-current regions, the inhibitor may be absorbed at the edge corners of the barrier layer 330; and prohibit the growth of the conductive layer 340 at the edge corners. At the edge corners of the barrier layer 330, the inhibitor may prevent the growth of the conductive layer 340 from both the lateral direction and the vertical direction. Thus, the pit defects 350 may be formed in the conductive layer 340.

Although the pit defects 350 may be formed in the conducive layer 340, the pit defects 350 may have following characteristics. First, the lateral distance between the bottoms of the pit defects 350 and the contact hole 220 may be relatively far. Because the edge corners of the barrier layer 330 may not only locate above the side surface of the contact hole 220, they may also be formed on the edge corners of the insulation layer 230 formed between the portions of the insulation layer 230 on the surface of the remaining mask layer 210 and the exposed surface of the substrate 200. Thus, during the initial stage for forming the conductive layer 340, the inhibitor in the electroplating solution may be distributed on a plurality of edge corners. Such a distribution of the inhibitor may avoid an excessively distribution of the inhibitor on the edge corners above the side surface of the contact hole 220. Thus, the inhibiting effect on the vertical growth of the conductive layer 340 above the side surface of the contact hole 220 may be reduced. Accordingly, the positions of the pit defects 350 formed in the conductive layer 340 may be pushed toward the side surface of the opening 211 (referring to FIG. 8).

As shown in FIG. 12, after forming the conductive layer 340, a planarization process may be performed onto the conductive layer 340, the barrier layer 330 and the insulation layer 230 until the surface of the mask layer 210 is exposed. After the planarization process, a conductive plug structure (not labeled) may be formed.

The planarization process may be any appropriate process, such as a chemical mechanical polishing process, or a physical mechanical polishing process. In one embodiment, the planarization process is a chemical mechanical polishing process. During the planarization process of the conductive layer 340, the barrier layer 330 and the insulation layer 230, the mask layer 210 is used as a stop layer.

Because the lateral distance between the bottoms of the pit defects 350 and the contact hole 220 may be relatively large. Further, the thickness of the insulation layer 230 may be greater than the thickness of the remaining mask layer 210. Although the surfaces of the pit defects 350 may also be recessed, or lowered, during the planarization process, when the planarization process is performed until the surface of the remaining mask layer 210 is exposed, the recessed pit defects 350 may be entirely removed. Thus, it may avoid forming a pit in the conductive layer 340 above the side wall of the contact hole 220.

When a metal layer is subsequently formed on the conductive layer 340, the unacceptable contact between the conductive layer 340 and the metal layer may be avoided; and the conductivity of the conductive plug structure may be improved. Further, the diffusion of the atoms in the conductive layer 340 may be prevented. Thus, the electro-migration and stress-migration may be avoided. Accordingly, the reliability of the conductive plug structure may be improved; and the performance of the conductive plug structure may be enhanced.

Thus, a conductive plug structure may be formed by the disclosed methods and processes. FIG. 12 illustrates a corresponding structure. As shown in FIG. 12, the conductive plug structure may include a substrate 200; and a conductive layer 340 penetrating through the substrate 200. The conductive plug structure may also include an insulation layer 330 formed between the conductive layer 340 and the substrate 200, and a barrier layer 330 formed between the insulation layer 230 and the conductive layer 340. The detailed structures and intermediate structures are described above with respect to the fabrication processes.

Thus, according to the disclosed methods and structures, by etching the mask layer, the feature size of the opening in the mask layer may be increased; and may be greater than the feature size of the contact hole. Thus, the enlarged opening may expose the surface of the substrate (or interlayer dielectric layer) around the contact hole. After forming the insulation layer, the insulation layer may not only cover the inner surface of the contact hole and the surface of the remaining mask layer, it may also cover the exposed surface of the substrate. Thus, the surface of the portion of the insulation layer on the remaining mask layer may be higher than the surface of the portion of the insulation layer on the exposed surface of the substrate; and the number of the edge corners in the insulation layer may be increased.

During the process for forming the conductive layer, the inhibitor in the electroplating solution may be distributed on the plurality of the edge corners. Thus, it may avoid an excessively distribution of the inhibitor on the edge corner regions above the sidewall of the contact hole. Accordingly, the inhibiting effect of the inhibitor on the vertical growth of the conductive layer above the sidewall of the contact hole may be reduced; and the pit defects formed in the conductive layer may be pushed toward the sidewall of the contact hole. Further, the thickness of the insulation layer may be equal to, or greater than the thickness of the remaining insulation layer.

After planarizing the conductive layer and the insulation layer, the pit defects may be entirely removed; and the pit between the conductive layer and the insulation layer may be avoided. When a metal layer is subsequently formed on the surface of the remaining conductive layer, the contact between the metal layer and the remaining conductive layer may be as desired; and the conductivity of the conductive plug structure may be improved. Further, it may also prevent the diffusion of the metal atoms in the conductive layer. Thus, the electro-migration and the stress-migration in the conductive layer may be avoided. Accordingly, the reliability of the conductive plug structure may be improved; and the performance of the conductive plug structure may enhanced.

Further, the ratio between the feature size of the enlarged opening in the mask layer and the feature size of the contact hole may be approximately 1.02-1.1. During the formation of the conductive layer, the position of the pit defects may have a relatively large distance with the contact hole. Thus, the recessed pit defects may also have a relatively large lateral distance with the contact hole during the planarization process. When the planarization process is performed to the surface of the mask layer, the effect on the portion of the conductive layer above the contact hole may be significantly reduced; and the surrounding surface of the conductive layer may be more level with the surface of the insulation layer. Further, the feature size of the enlarged opening may be relatively small, the stop-layer function of the mask layer may not be weakened during the planarization process.

Further, before forming the conductive layer, a barrier layer may be formed on the insulation layer. The barrier layer may be able to prevent the atoms in the conductive layer from diffusing into the substrate; and to increase the adhesion force between the conductive layer and the insulation layer during the process for forming the conductive layer.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a conductive plug structure, comprising:
   providing a substrate;
   forming a mask layer having an opening on a surface of the substrate;
   etching the substrate to form a contact hole using the mask layer as an etching mask;
   after forming the contact hole using the mask layer as the etching mask, etching the mask layer to increase a feature size of the opening;
   forming an insulation layer on an inner surface of the opening, an inner surface of the enlarged opening and a surface of the mask layer to have more edge corners, a thickness of the insulation layer being greater than a thickness of the remaining mask layer;
   forming a conductive layer filling the contact hole on the insulation layer; and
   planarizing the conductive layer and the insulation layer until a surface of the mask layer is exposed.

2. The method according to claim 1, wherein:
   a ratio between a feature size of the enlarged opening and a feature size of the contact hole is in a range of approximately 1.02-1.1.

3. The method according to claim 1, wherein:
   the mask layer is made of one of silicon oxide and silicon nitride; and
   the mask layer is etched by a wet etching process;
   an etching solution of the wet etching process is a phosphorous acid solution;
   a mass concentration of the phosphorous acid solution is in a range of approximately 80%-90%; and
   a temperature of the wet etching process is in a range of approximately 120° C.-180° C.

4. The method according to claim 1, wherein:
   a thickness of the remaining mask layer is in a range of approximately 800 Å-1200 Å.

5. The method according to claim 1, wherein:
   the conductive layer is made of one of Ta, TaN, and Cu;
   the conductive layer is formed by an electroplating process; and
   the conductive layer and the insulation layer are planarized by a chemical mechanical polishing process.

6. The method according to claim 1, wherein:
   the insulation layer is made of silicon oxide; and
   the insulation layer is formed by an atomic layer deposition process.

7. A method for fabricating a conductive plug structure, comprising:
   providing a substrate;
   forming a mask layer having an opening on a surface of the substrate;
   etching the substrate to form a contact hole using the mask layer as an etching mask;
   after forming the contact hole using the mask layer as the etching mask, etching the mask layer to increase a feature size of the opening;
   forming an Insulation layer on an inner surface of the opening, an inner surface of the enlarged opening and a surface of the mask layer to have more edge corners, a thickness of the insulation layer being greater than a thickness of the remaining mask layer;
   forming a barrier layer on the insulation layer;

forming a conductive layer filling the contact hole on the barrier layer; and planarizing the conductive layer, the barrier layer and the insulation layer until a surface of the mask layer is exposed.

8. The method according to claim 7, wherein:
the barrier layer is made of one of TiN and TaN; and
the barrier layer is formed by a physical vapor deposition process.

9. The method according to claim 7, wherein:
a ratio between a feature size of the enlarged opening and a feature size of the contact hole is in a range of approximately 1.02-1.1.

10. The method according to claim 7, wherein:
the mask layer is made of one of silicon oxide and silicon nitride; and
the mask layer is etched by a wet etching process;
an etching solution of the wet etching process is a phosphorous acid solution;
a mass concentration of the phosphorous acid solution is in a range of approximately 80%-90%; and
a temperature of the wet etching process is in a range of approximately 120° C.-180° C.

11. The method according to claim 7, wherein:
a thickness of the remaining mask layer is in a range of approximately 800 Å-1200 Å.

12. The method according to claim 7, wherein:
the conductive layer is made of one of Ta, TaN, and Cu;
the conductive layer is formed by an electroplating process; and
the conductive layer and the insulation layer are planarized by a chemical mechanical polishing process.

13. The method according to claim 7, wherein:
the insulation layer is made of silicon oxide; and
the insulation layer is formed by an atomic layer deposition process.

14. A conductive plug structure, comprising:
a substrate;
a conductive layer penetrating into the substrate; and
an insulation layer formed between the substrate and the conductive layer,
wherein the conductive layer is formed by:
 forming a mask layer having an opening on a surface of the substrate;
 etching the substrate to form a contact hole using the mask layer as an etching mask;
 after forming the contact hole using the mask layer as the etching mask, etching the mask layer to increase a feature size of the opening;
 forming an insulation layer on an inner surface of the opening, an inside surface of the enlarged opening and a surface of the mask layer to have more edge corners, a thickness of the insulation layer being greater than a thickness of the remaining mask layer;
 forming a conductive layer filling the contact hole on the insulation layer; and
 planarizing the conductive layer and the insulation layer until a surface of the mask layer is exposed.

15. The conductive plug structure according to claim 14, further comprising:
a barrier layer formed between the insulation layer and the conductive layer.

16. The conductive plug structure according to claim 15, wherein:
the barrier layer is made of one of TaN and TiN.

17. The conductive plug structure according to claim 14, wherein:
the mask layer is made of silicon nitride; and
the thickness of the mask layer is in a range of approximately 800 Å-1200 Å.

18. The conductive plug structure according to claim 14, wherein:
the conductive layer is made of one of Ta, TaN, and Cu.

19. The conductive plug structure according to claim 14, wherein:
the insulation layer is made of silicon oxide.

20. The conductive plug structure according to claim 14, wherein:
a ratio between a feature size of the enlarged opening and a feature size of the contact hole is in a range of approximately 1.02-1.1.

* * * * *